(12) United States Patent
Bentley (10) Patent No.: US 8,393,076 B2
(45) Date of Patent: Mar. 12, 2013

(54) ELECTRICAL CONNECTION OF COMPONENTS

(75) Inventor: Philip Gareth Bentley, Cambridge (GB)

(73) Assignee: Conductive Inkjet Technology Limited, Ossett (GB)

( * ) Notice: Subject to any disclaimer, the term of this patent is extended or adjusted under 35 U.S.C. 154(b) by 843 days.

(21) Appl. No.: 12/531,856

(22) PCT Filed: Mar. 17, 2008

(86) PCT No.: PCT/GB2008/000935
§ 371 (c)(1),
(2), (4) Date: Sep. 17, 2009

(87) PCT Pub. No.: WO2008/113994
PCT Pub. Date: Sep. 25, 2008

(65) Prior Publication Data
US 2010/0032199 A1    Feb. 11, 2010

Related U.S. Application Data

(66) Substitute for application No. 60/918,913, filed on Mar. 20, 2007.

(30) Foreign Application Priority Data

Mar. 20, 2007    (GB) .................................. 0705287.1

(51) Int. Cl.
*H05K 3/30*    (2006.01)
(52) U.S. Cl. ................ 29/832; 29/830; 29/831; 29/833; 29/840; 29/842
(58) Field of Classification Search ............ 29/830, 29/832, 831, 833, 840, 842, 846
See application file for complete search history.

(56) References Cited

U.S. PATENT DOCUMENTS

| | | | | |
|---|---|---|---|---|
| 4,965,653 | A | 10/1990 | Otsuka et al. | 357/55 |
| 5,042,145 | A | 8/1991 | Boucquet | 29/840 |
| 6,259,408 | B1 | 7/2001 | Brady et al. | 343/700 MS |
| 6,624,520 | B1 | 9/2003 | Nakamura | 257/778 |
| 7,127,810 | B2 * | 10/2006 | Kasuga et al. | 29/833 |

(Continued)

FOREIGN PATENT DOCUMENTS

| DE | 44 41 052 A1 | 5/1996 |
|---|---|---|
| DE | 102 10 841 A1 | 10/2003 |

(Continued)

OTHER PUBLICATIONS

International Search Report (PCT/GB2008/000935).

(Continued)

*Primary Examiner* — Derris Banks
*Assistant Examiner* — Azm Parvez
(74) *Attorney, Agent, or Firm* — Morgan, Lewis & Bockius LLP (57) ABSTRACT

A component is electrically connected to an electrical circuit by a method that comprises forming an intermediate product in which the component (3) is disposed on one side of an electrically conducting sheet (1) so that at least one pair of contacts (4) of the component are electrically connected by the sheet and in which a patterned etch resist layer (2) is disposed on the other side of the sheet in registration with the component on said one side of the sheet, and then exposing the other side of the sheet to an etching agent and thereby removing areas of the sheet to leave the electrical circuit and also to remove the electrical interconnection between the contacts.

21 Claims, 13 Drawing Sheets

U.S. PATENT DOCUMENTS

| | | | |
|---|---|---|---|
| 2002/0079594 A1 | 6/2002 | Sakurai | 257/778 |
| 2004/0063332 A1 | 4/2004 | Seko | 438/734 |
| 2004/0169086 A1 | 9/2004 | Ohta et al. | 235/492 |
| 2004/0203244 A1 | 10/2004 | Oshima | 438/107 |
| 2005/0006142 A1 | 1/2005 | Ishimaru et al. | 174/262 |
| 2005/0070046 A1 | 3/2005 | Saito | 438/106 |
| 2005/0141150 A1 | 6/2005 | Bentley et al. | 361/2 |
| 2005/0199929 A1 | 9/2005 | Horikawa et al. | 257/296 |

FOREIGN PATENT DOCUMENTS

DE 10210841 A1 * 10/2003

OTHER PUBLICATIONS

UK Search Report (GB 0705287.1).

* cited by examiner

ELECTRICAL CONNECTION OF COMPONENTS

This application is a 371 filing of PCT/GB2008/000935 (WO 2008/113994), filed Mar. 17, 2008, claiming priority benefit of GB 0705287.1, filed Mar. 20, 2007 and U.S. Provisional Patent Application No. 60/918,913, filed Mar. 20, 2007.

FIELD OF THE INVENTION

This invention relates to a method of electrically connecting a component to an electrical circuit, and to the resulting circuitry. The invention has particular, but not exclusive, application to the manufacture of cards for RFID (radio frequency identification devices) and IC cards, so called smart cards, where a component such as an integrated circuit is attached to an antenna or other electrically conductive element.

BACKGROUND TO THE INVENTION

The basic components of an RFID chip or tag for an RFID card comprise a substrate (usually a plastic film or paper), a patterned conductive antenna and an integrated circuit which may store data and be interrogated. The RFID industry is mainly driven by cost and significant advances have been made in reducing the cost of the chips which are used in RFID. A significant amount of work has also occurred in bringing down the cost of the antenna. The utilisation of additive metallization methods, printing and low-cost materials have all contributed to a reduction in the cost of antenna production. However, a significant cost in the manufacture of the RFID card still comes from the process of attaching the chip to the antenna. As well as the need to form a conductive bond between the chip and antenna, the precision with which the chip must be placed requires expensive and relatively slow equipment.

RFID antennas and other electrical conductive elements are traditionally manufactured by a process of masking and etching metal-covered substrates. For example, a plastic or composite substrate (e.g. PET or FR4 epoxy composite) is co-laminated with a copper or aluminium foil. The metal structure would then be coated and patterned with an etch resistant material (e.g. photoresist) and then immersed in a chemical etchant (ferric chloride, nitric acid or a mixture of peroxide and sulphuric acid in the case of copper, hydrochloric acid or sodium hydroxide in the case of aluminium) to remove the excess metal foil. The etch resist would then be removed to leave a patterned metal layer in the form of an antenna. The RFID inlay would then be completed by attaching an RFID chip to the antenna such that raised contact bumps on the surface of the chip come into electrical contact with contact pads at the feed points of the antenna. This may be done by first connecting these bumps to a larger metal structure (known as a strap or interposer) which is then bonded to the antenna, or by directly placing the chip face down on the antenna with the contact bumps on top of the contact pads. In either case, good electrical contact and mechanical bonding are achieved by the use of a conductive adhesive paste or film. In many cases this adhesive is anisotropically conductive (i.e. the conductivity in the lateral or in-plane direction is much lower than that in the vertical direction) so as to prevent shorting between the bumps.

In an alternative approach the antenna itself may be fabricated using an additive patterning technique. Under this methodology the conductive region is added patternwise (usually using a printing technique) to the insulating substrate. This may be done by printing a paste or suspension of metal particles such as silver or copper. Alternatively it may be achieved by printing a catalytic material which is then coated with metal using a process of electroless deposition. In either case the antenna conductivity may be further increased by subsequent electrolytic plating.

In the above cases, the conducting materials in their chosen form are usually found to be far more costly than simple metal foils. In particular, aluminium foil is particularly abundant and available at significantly lower cost (per unit area) than the materials usually used for antenna manufacture. Consequently, some manufacturers choose to directly die-cut aluminium foil to form antennas. This method, although cheap, greatly limits the complexity of the antennas which may be formed and leads to great difficulties in the handling of the materials during subsequent processes.

In addition to the cost of the antenna, the cost of accurately locating the bumped pads of the chips to the contacts on the antenna is also significant (in terms of process time and the capital equipment involved).

As an alternative approach, the applicants have demonstrated (e.g. in WO 2005/044451) the ability to place the chip relatively inaccurately with the contact pads facing upwards, and utilise the digital nature of inkjet printing to print the connection between the antenna and the contact bumps. Even so, this process still requires the fabrication of an antenna by either a traditional additive or subtractive method. The invention employs a different way of ensuring that there is accurate registration between the component and the electrical circuit to which it is to be electrically connected.

SUMMARY OF THE INVENTION

According to the invention there is provided a method of electrically connecting a component to an electrical circuit, the method comprising forming an intermediate product in which the component is disposed on one side of an electrically conducting sheet so that at least one pair of contacts of the component are electrically connected by the sheet and in which a patterned etch resist layer is disposed on the other side of the sheet in registration with the component on said one side of the sheet, and then exposing the other side of the sheet to an etching agent and thereby removing areas of the sheet to leave the electrical circuit and also to remove the electrical interconnection between the contacts.

Thus, in the inventive method the component is disposed on said one side of the sheet and the etch resist layer accurately positioned on the other side, before the etching step takes place. The etch resist layer may be disposed on the other side of the sheet by a digital printing process, such as inkjet printing.

Preferably, the patterned etch resist layer is applied to the other side of the sheet in the required registration by an optical system which locates the position at which the component is disposed on the said one side of the sheet. The optical system may locate indentations in the sheet produced by contact bumps on the component. This allows for the component to be disposed on said one side of the sheet relatively inaccurately because the optical system accurately positions the patterned etch resist layer with respect to the component.

In one preferred method the intermediate product is formed by applying the patterned etch resist layer to the other side of the sheet and then disposing the component on said one side of the sheet.

In an alternative method, the intermediate product is formed by disposing the component on said one side of the sheet and then applying the patterned etch resist layer to the other side of the sheet.

The intermediate product may be formed by applying a further etch resist layer to said one side of the sheet and to the exposed surface of the component, and in this case the further etch resist layer may be applied to the one side of the sheet wholly or substantially covering the one side of the sheet so as to form a substrate.

The further etch resist layer applied to said one side of the sheet may have a pattern and may be exposed to a corresponding etching agent which removes areas of the sheet not covered by the etch resist layer on said one side of the sheet, whereby the electrical circuit is defined by pathways formed by etching from both sides of the sheet. In this case the etch resist layers may be made of the same etch resistant material and may be subjected simultaneously to the same etching agent, for example by dipping into the etching agent.

The component may be an integrated circuit chip but may also be a resistor, inductor, or capacitor which could be printed directly onto the sheet. The sheet may be made of any electrically conductive material, metal or non-metal, but is preferably aluminium foil because this is inexpensive and available in a readily useable form.

BRIEF DESCRIPTION OF THE DRAWINGS

Methods according to the invention, and the products obtained therefrom, will now be described, by way of example, with reference to the accompanying drawings, in which:

FIG. 1, consisting of FIGS. 1a to 1f, illustrates a first method,

FIG. 2, consisting of FIGS. 2a to 2e, illustrates a second method,

FIG. 3, consisting of FIGS. 3a to 3e, illustrates a third method,

FIG. 4, consisting of FIGS. 4a to 4e, illustrates a fourth method,

FIG. 5, consisting of FIGS. 5a to 5e, illustrates a fifth method,

FIG. 6, consisting of FIGS. 6a to 6d, illustrates a sixth method,

FIG. 7, consisting of FIGS. 7a to 7d, illustrates a seventh method,

FIG. 8, consisting of FIGS. 8a to 8d, illustrates a eighth method,

FIG. 9, consisting of FIGS. 9a to 9e, illustrates an ninth method,

FIG. 10, consisting of FIGS. 10a to 10c, illustrates a tenth method,

FIG. 11, consisting of FIGS. 11a to 11f, illustrates a eleventh method, and

DETAILED DESCRIPTION OF THE DRAWINGS

Throughout the drawings corresponding parts bear the same reference numerals.

Referring to FIG. 1, a continuous electrically conducting sheet in the form of a metal foil 1 has applied to a surface a patterned etch resist layer 2 defining an electrical circuit to be formed. A component in the form of a chip 3 with spaced contact pads 4 is placed on the opposite side of the foil 1 such that the contact pads 4 make electrical contact with the foil 1 and register with the areas of the etch resist layer 2. The component side of the foil 1 is completely coated with a second etch resist layer 5 which fills the region 6 between the pads 4 and thus forms an underfill.

Figure 1A:
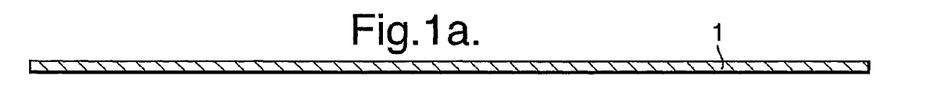
Figure 1B:
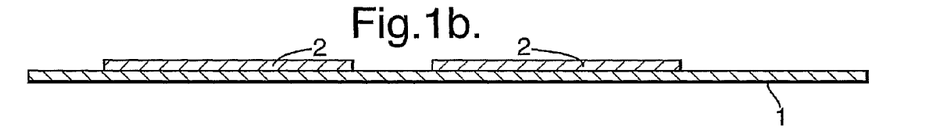
Figure 1C:
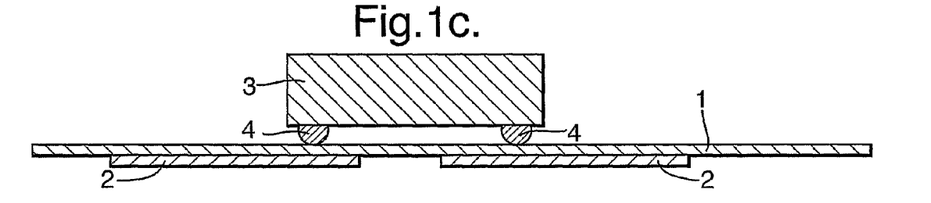
Figure 1D:
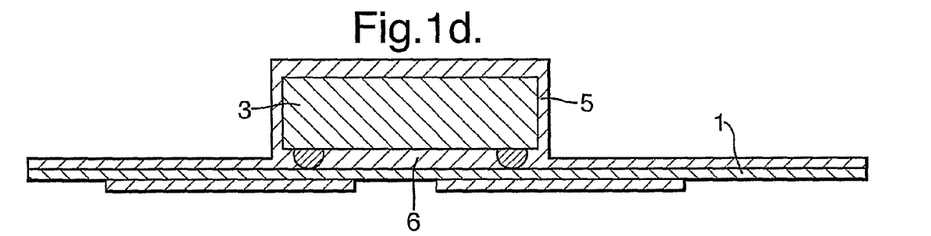
Figure 1E:
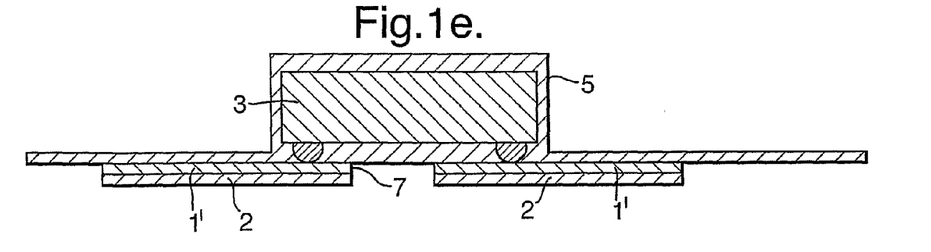
Figure 1F:
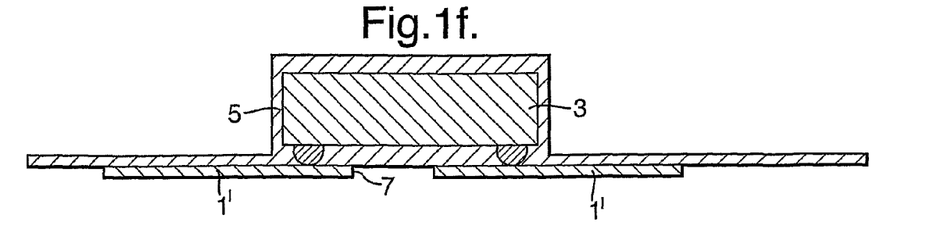

The resulting intermediate product of FIG. 1d is then immersed in a chemical or other etch solution which dissolves the unprotected areas of foil so as to leave conductive regions 1' of the foil corresponding to the areas covered by the etch resist layer 2. Also, this etching process removes the metal foil between the contact pads 4 and thus breaks the electrical contact between the pads 4, as shown by the discontinuity 7 in the foil (FIGS. 1e and 1f). The etch resist layer 2 may be left in place to form a substrate for the resulting device, or it may be stripped away (FIG. 1f).

The application of the etch resist layer 2 may be performed patternwise by a process such as analogue or digital printing (e.g. screen, flexo, gravure, inkjet printing or laser printing). Alternatively, the mask represented by the layer 2 may be applied by a traditional photo lithographic method such as the application of a photo resist (dry film or liquid), subsequent exposure to light through a mask, followed by a developing stage.

Also, the chip 3 may be secured to the metal foil 1 by using an adhesive which may be cured or allowed to set. Alternatively, the second etch resist layer 5 may be used to completely flow around the chip and bond it to the substrate.

A chemical etch material may be used to remove unprotected metal. Alternatively other etching processes such as electrochemical or plasma etching may also be used. In the case of plasma etching the process may be non-directional or directional, such as reactive ion etching.

FIG. 2 differs from FIG. 1 in that the chip 3 is first placed in contact with one surface of the metal foil 1, and the patterned etch resistant layer 2 then applied to the other side of the foil. In common with FIG. 1, the chip side is then completely coated with a second etch resist layer 5 to form the intermediate product (FIG. 2c) identical to that of FIG. 1d. The resulting product is then etched, FIG. 2d, and the etch resist layer 2 may then be stripped away, as shown in FIG. 2e.

FIG. 3 shows a variation of the method of FIG. 2. In FIG. 3, the layer 2 has several strips (FIG. 3b) so the intermediate product appears as illustrated in FIG. 3c. After etching, there are a plurality of discontinuities 7 between the separated pathways which then correspond to the strips of the layer 2, as shown in FIG. 3d. If the layer 2 is stripped away, the result is as shown in FIG. 3e. The method of FIG. 3 is especially relevant to HF (13.56 MHz) RFID tags where the tag is usually in the form of a spiral and one of the major manufacturing problems is making a connection from the inside of the spiral to the outside without shorting the tracks in between. A chip on an interposer could be used to bridge the gap. An insulating adhesive may also be used so as to insulate from the intermediate tracks. Failing that a metal strip with an insulating coating under it could also be used to bridge the gap.

Figure 4A:
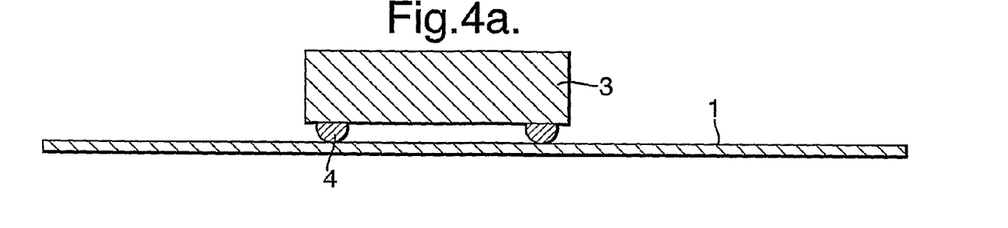
Figure 4B:
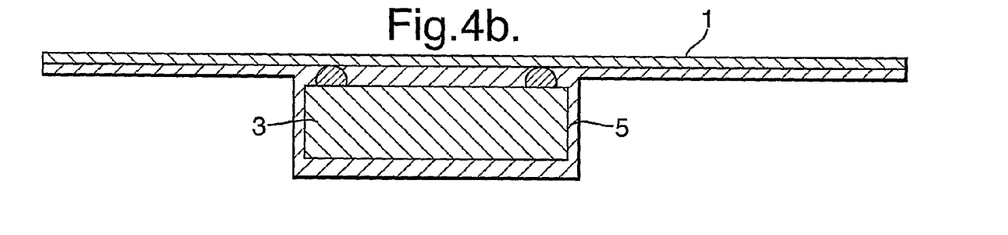

In FIG. 4 the chip 3 is first placed on the metal foil 1 (FIG. 4a) after which the etch resist layer 5 is coated over the chip side of the foil (FIG. 4b). The patterned etch resist layer 2 is then applied to the opposite side of the foil (FIG. 4c) to form the intermediate product which is then etched (FIG. 4d), after which the patterned etch resist layer 2 may be stripped (FIG. 4e).

Referring to FIG. 5, the chip 3 is adhered to the metal foil 1 (FIG. 5a) using an adhesive material 8. The layer 2 is then applied (FIG. 5b). The material 8 may or may not be used as an etch resistant material which ensures that the area between the contact pads is completely filled. FIG. 5c represents the intermediate product which is then subjected to etching, FIG. 5d, and then optional stripping of the patterned etch resist layer 2, as shown in FIG. 5e.

The variation shown in FIG. 6 uses a conductive material 9 for adhering the chip pads 4 to the metal foil 1. The conductive material 9 may be an electrically conductive paste or glue, solder or other electrically conductive material. The etch resist layer 2 is then applied to the opposite side of the foil, as shown in FIG. 6b, and after this the further etch resist layer 5 is applied to the chip side of the foil so as to cover the foil and the exposed areas of the chip. This results in the intermediate product shown in FIG. 6c where it can be seen that the material forming the etch resist layer 5 has flowed under the chip by capillary action and thus acts as an underfill. The intermediate product of FIG. 6c is then etched, as previously described, the result being illustrated in FIG. 6d.

In the method illustrated in FIG. 7, the chip 3 is adhered to the foil 1 using an anisotropic conductive paste or an anisotropic conductive film 10. This is a material which comprises a binder layer and sparsely distributed conductive particles such that when the chip 3 is pressed into the film or paste 10 the particles are pressed together to make the film or paste conductive only in the vertical direction, or the direction of compression. This has the advantage that it ensures good electrical connection to the foil without causing short circuit between the contact pads 4. After the chip has been adhered in this way, the patterned etch resist layer 2 is then applied (FIG. 7b) and the second etch resist layer 5 is applied (FIG. 7c). This intermediate product is then etched to produce the product shown in FIG. 7d.

Figure 2A:
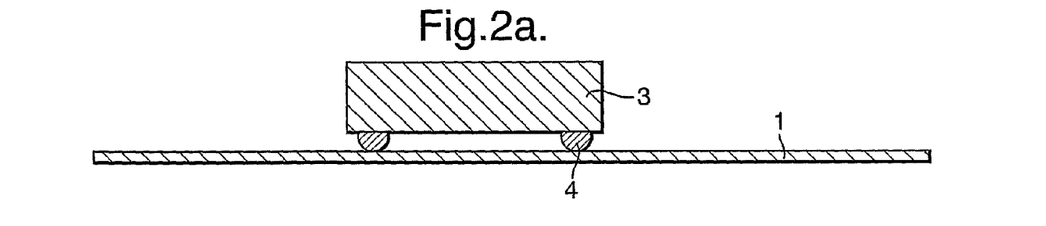
Figure 2B:
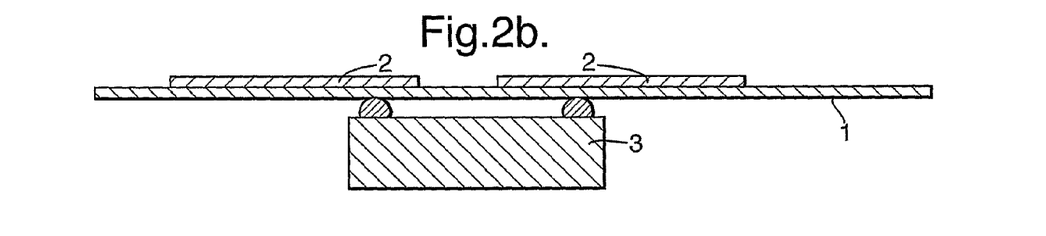
Figure 2C:
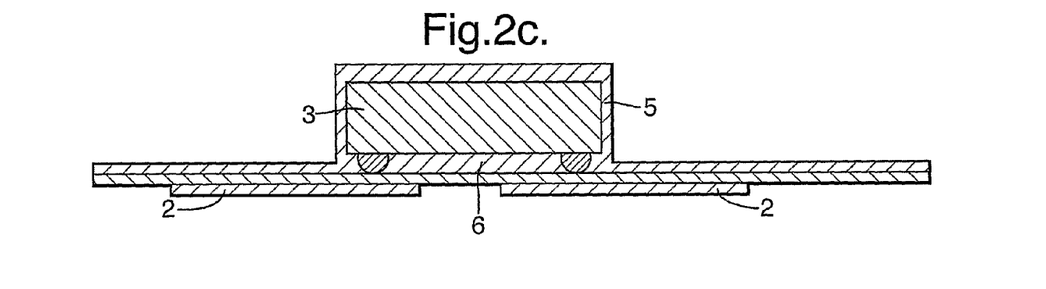
Figure 2D:
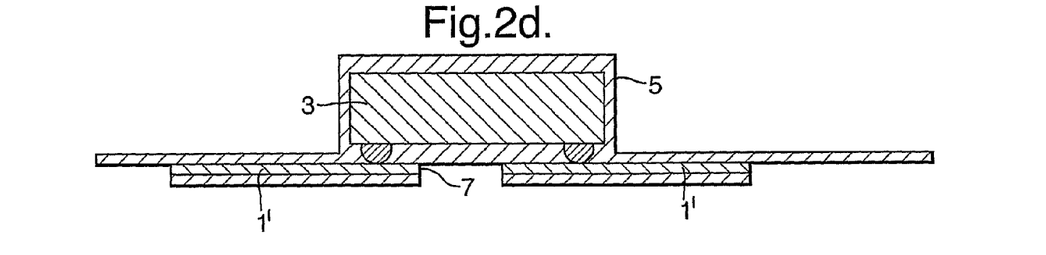
Figure 2E:
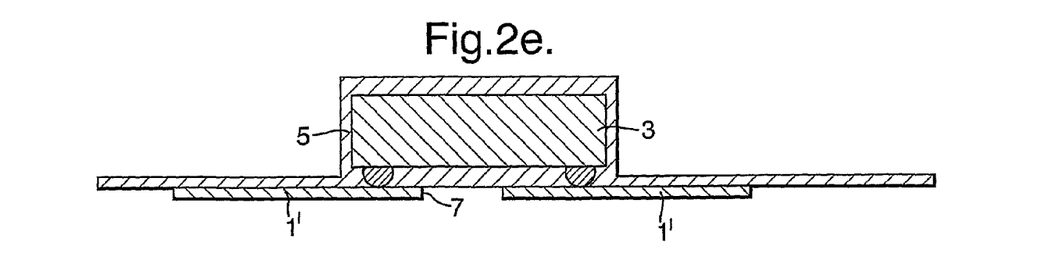
Figure 3A:
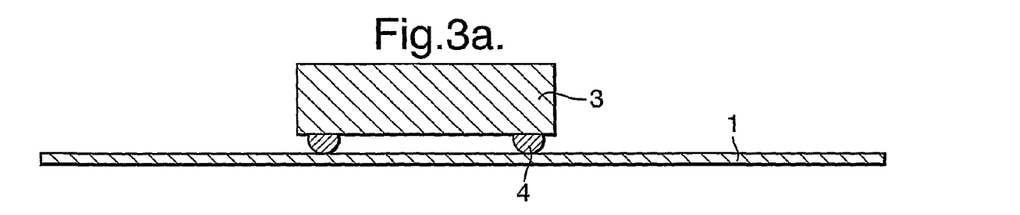
Figure 3B:
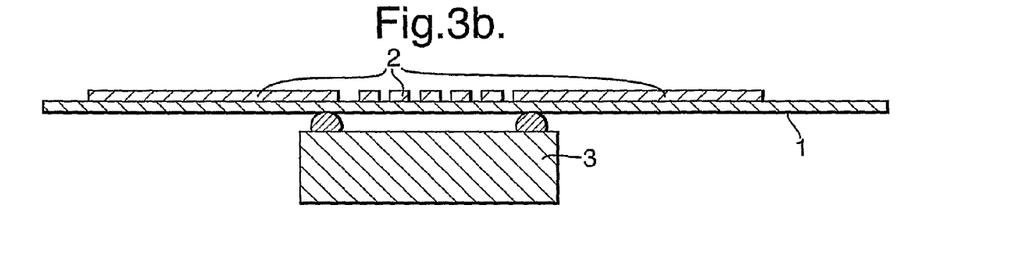
Figure 3C:
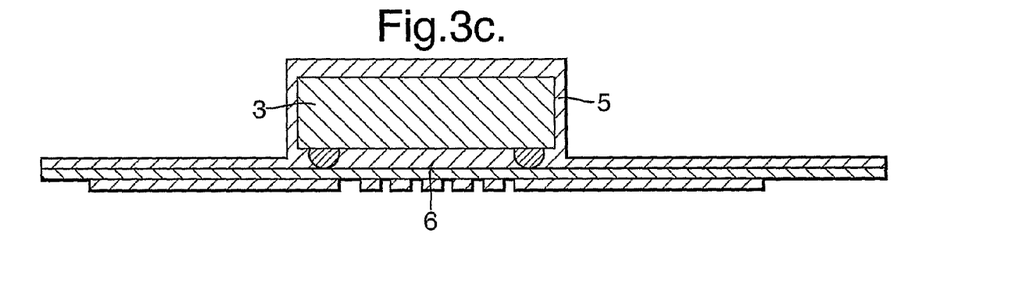
Figure 3D:
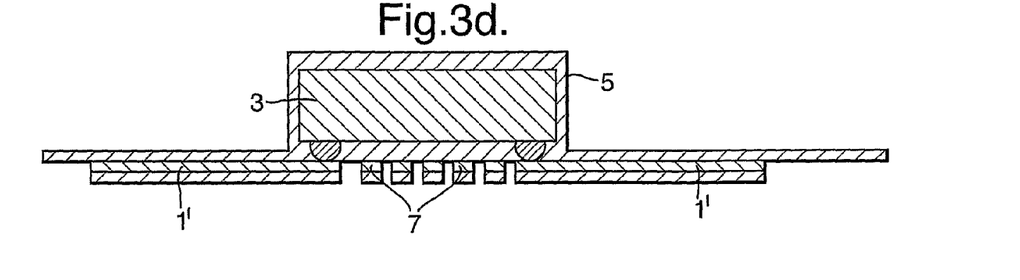
Figure 3E:
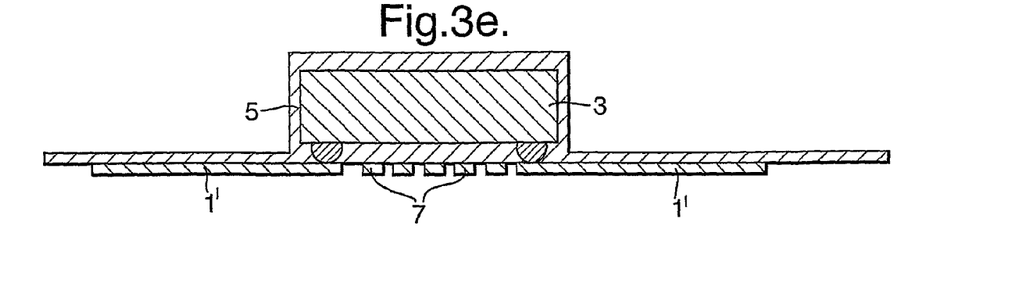
Figure 8A:
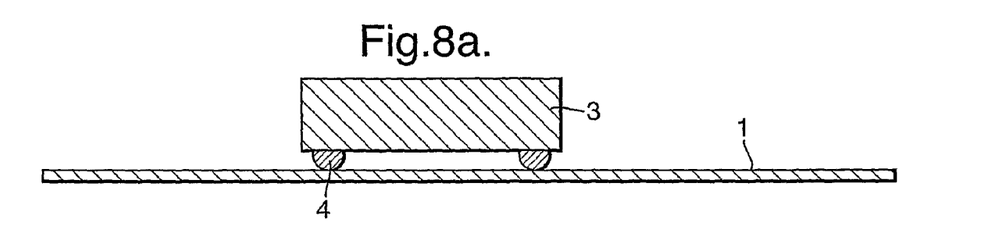
Figure 8B:
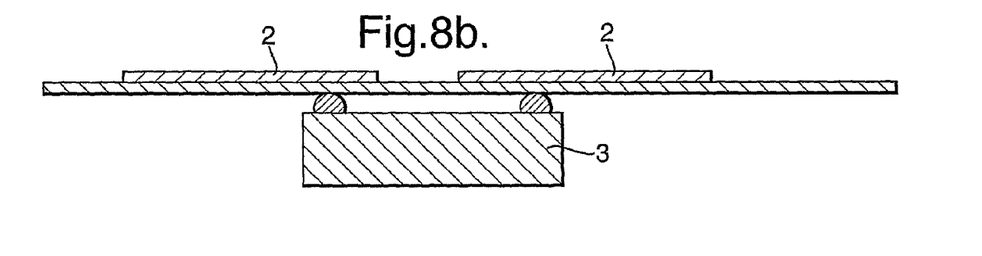
Figure 8C:
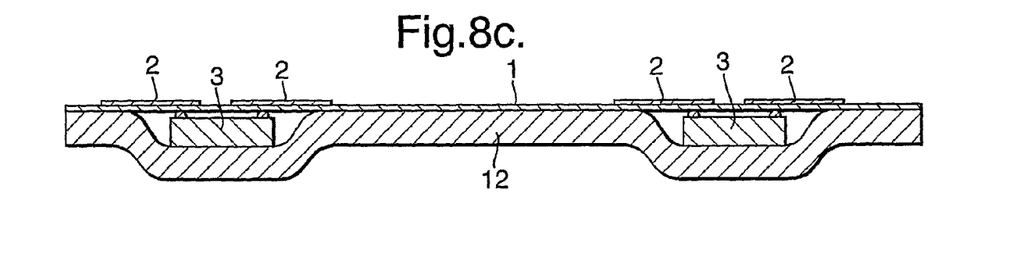
Figure 8D:
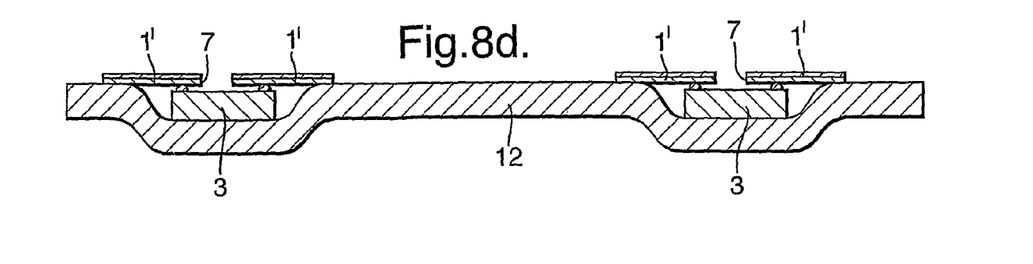

FIGS. 8a and 8b correspond to FIGS. 2a and 2b. FIG. 8c shows how a plurality of chips 3 can be placed on the foil 1 to provide a plurality of devices. A second etch resist layer 12 is then applied, FIG. 8c, after which etching proceeds to give the result illustrated in FIG. 8d.

It will be appreciated that the second etch resist layer 12 may be formed by a lamination process or by the deposition of a liquid which is then solidified or allowed to solidify. Also, the second etch resist material may be applied as a continuous layer or may be applied pattern wise such that the device substrates are also patterned or partially or fully singulated after the etching process.

Figure 9A:
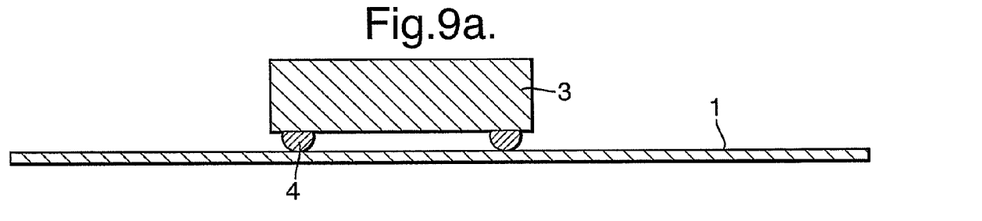
Figure 9B:
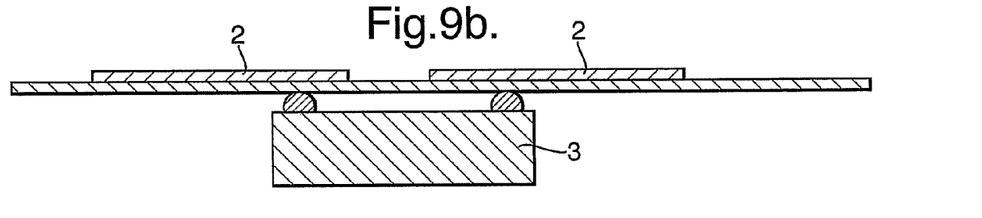
Figure 9C:
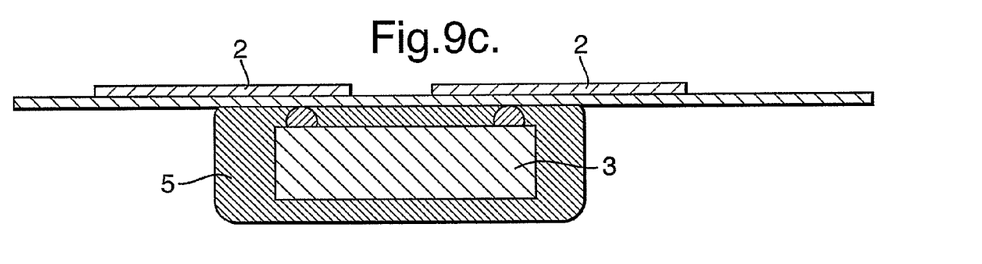
Figure 9D:
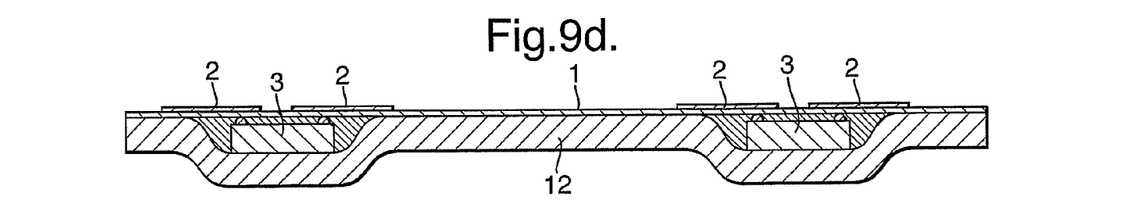
Figure 9E:
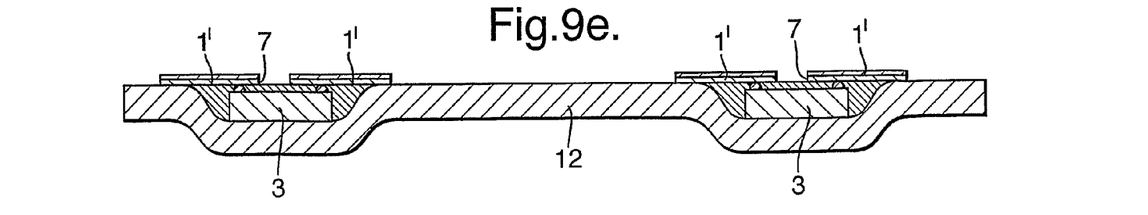

FIGS. 9a and 9b respectively correspond to FIGS. 8a and 8b. FIG. 9c shows the second etch resist layer applied to the chip side of the foil and acting as an underfill, and FIG. 9d illustrates how a further etch resist layer 12 may be laminated onto the structure, after which etching takes place to produce the result shown in FIG. 9e.

Figure 10A:
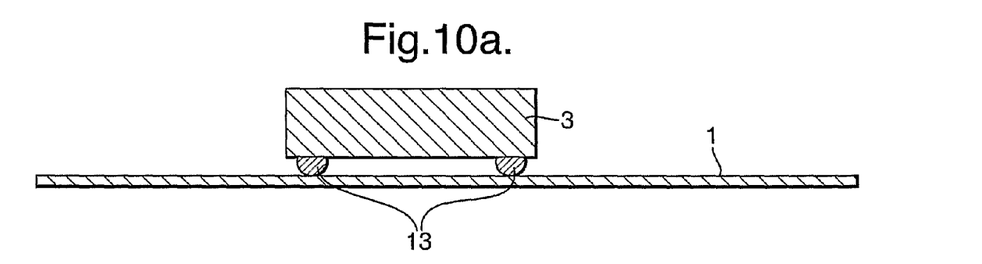
Figure 10B:
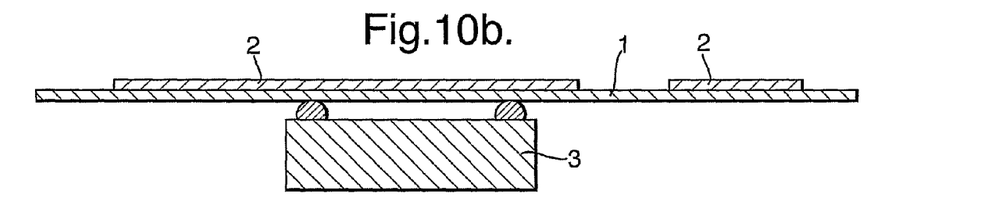
Figure 10C:
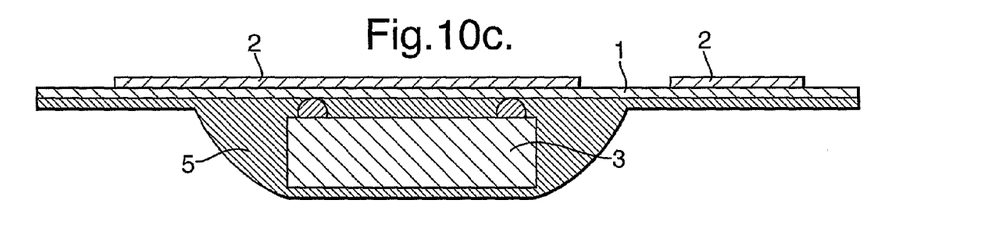

FIG. 10 illustrates how certain contact pads 13 of the chip 3 are initially short circuited by the foil 1 and deliberately remain short circuited even after the etching process, as illustrated by FIG. 10c. The chip also has pads which are electrically isolated by the etching process, as in the preceding methods, and one such pad may be one of the pads 13.

Figure 4C:
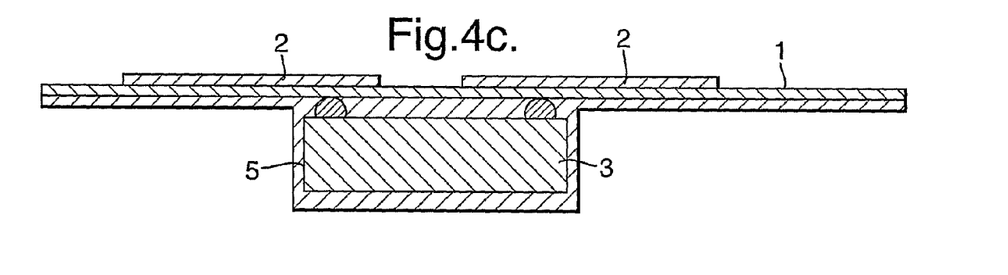
Figure 4D:
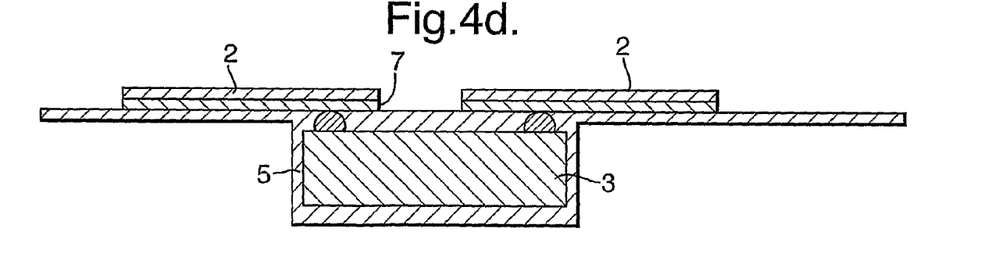
Figure 4E:
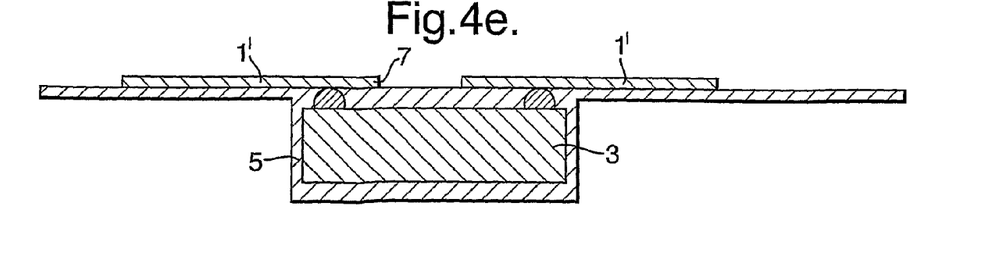
Figure 5A:
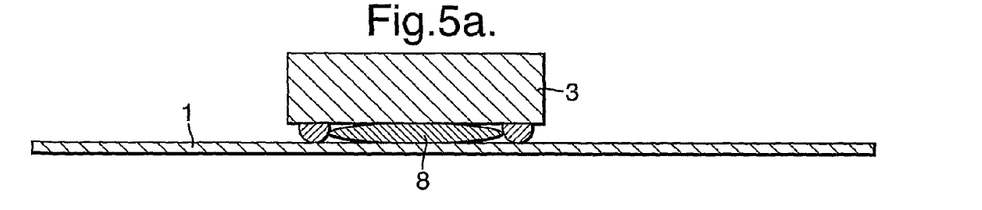
Figure 5B:
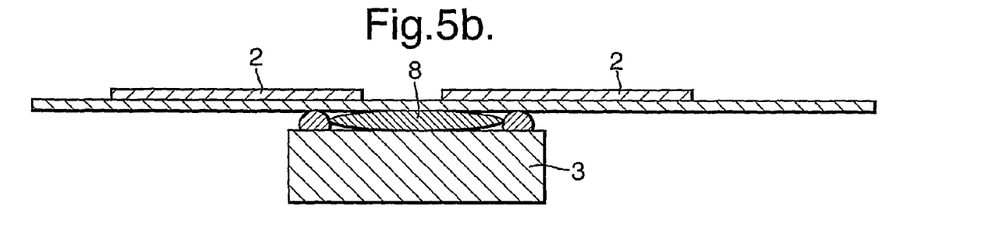
Figure 5C:
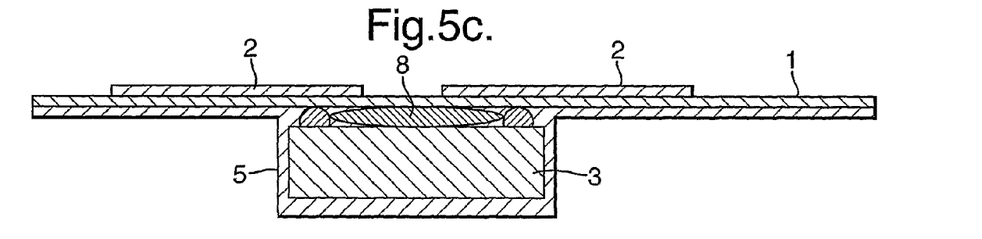
Figure 5D:
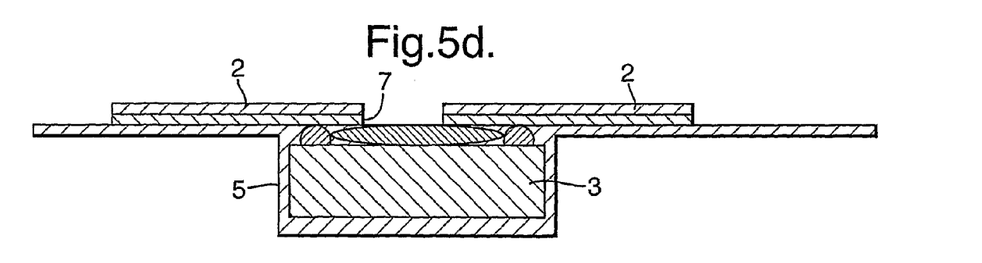
Figure 5E:
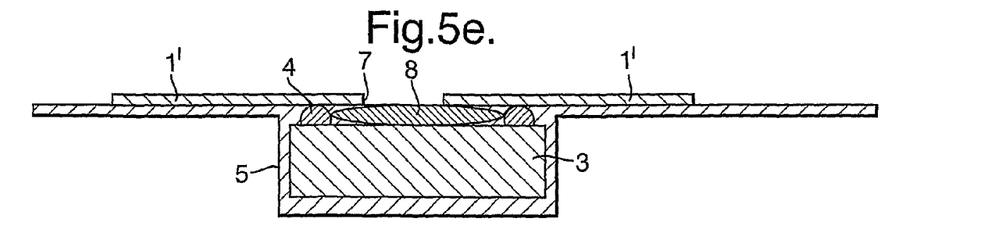
Figure 6A:
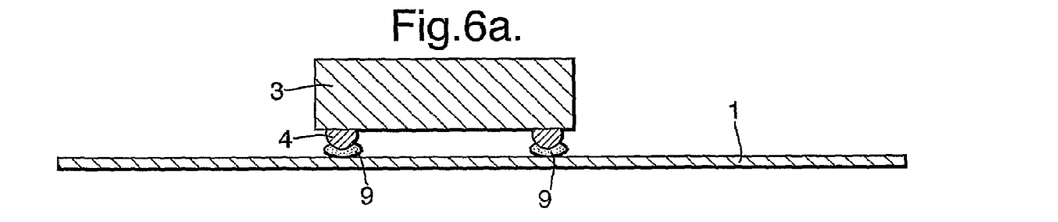
Figure 6B:
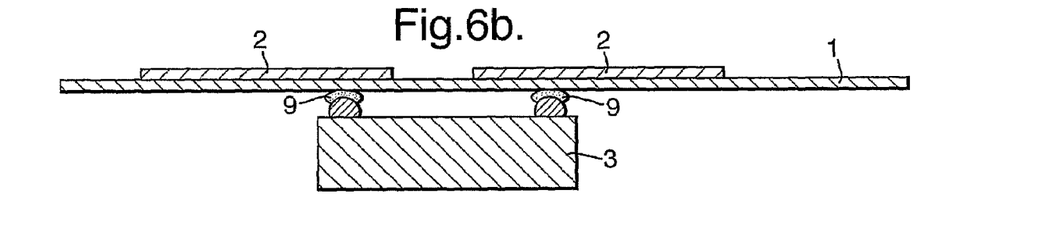
Figure 6C:
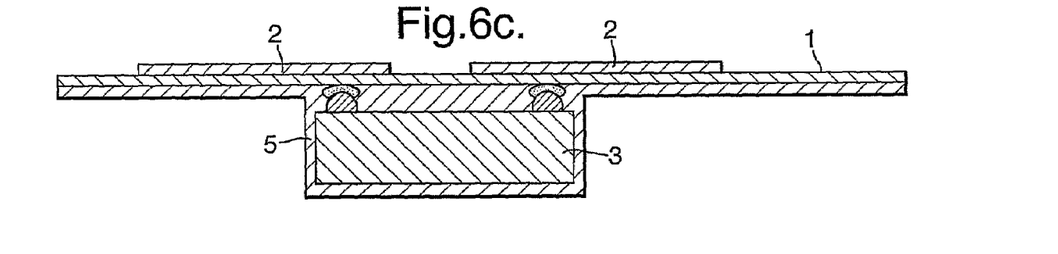
Figure 6D:
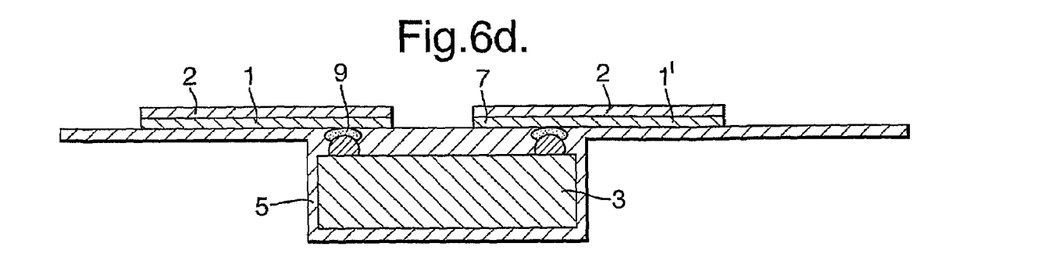
Figure 7A:
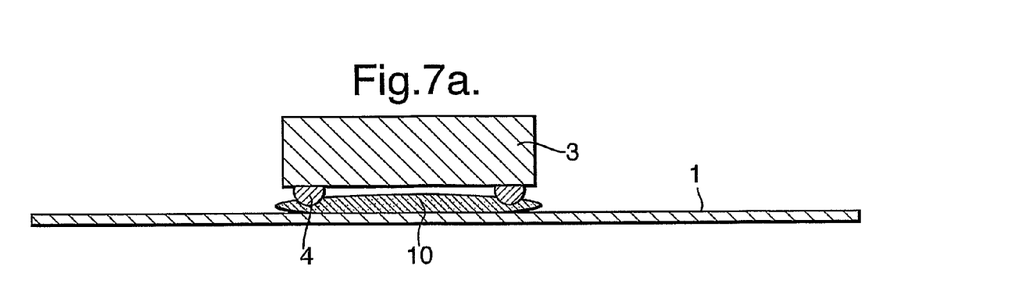
Figure 7B:
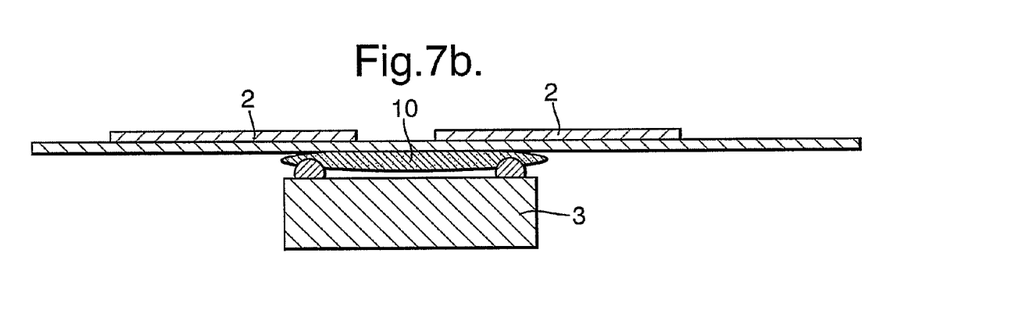
Figure 7C:
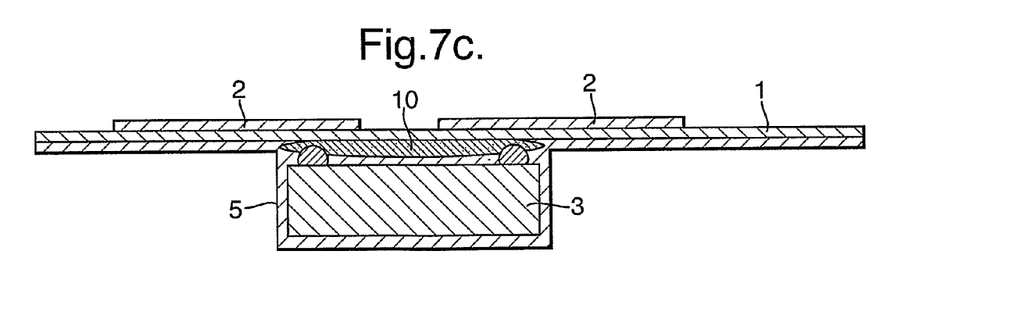
Figure 7D:
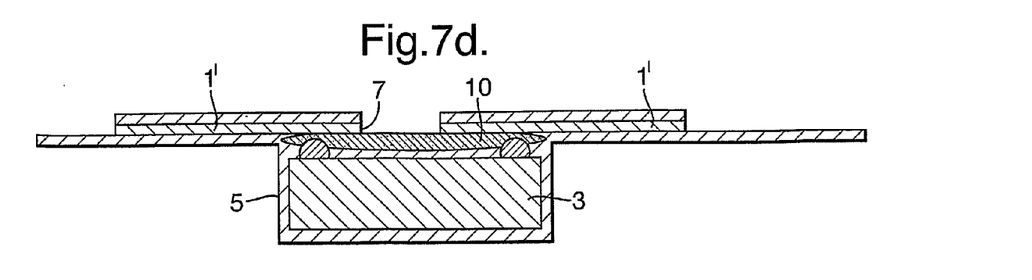
Figure 11A:
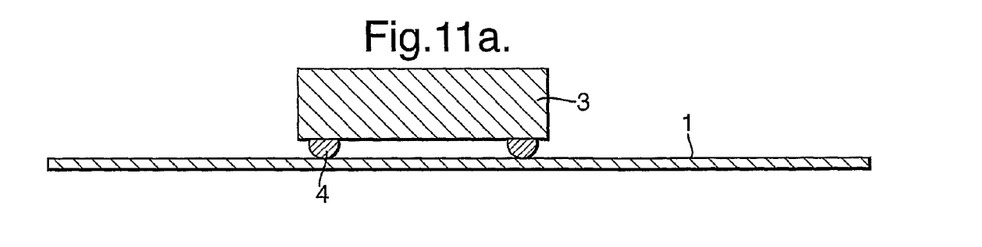
Figure 11B:
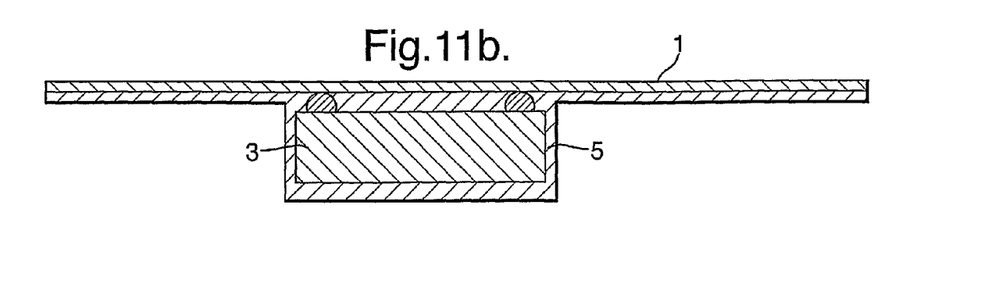
Figure 11C:
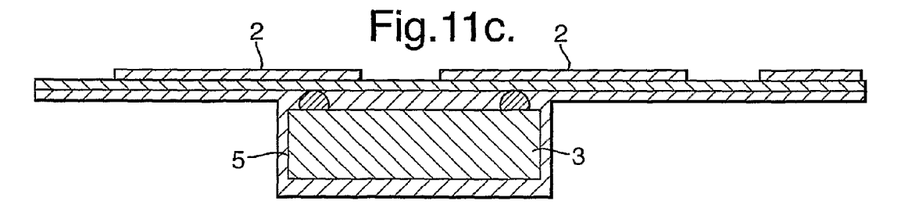
Figure 11D:
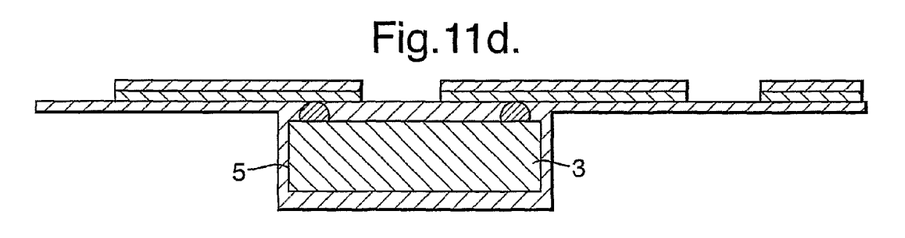
Figure 11E:
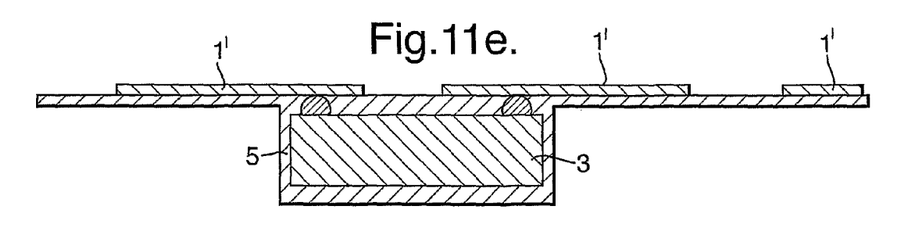
Figure 11F:
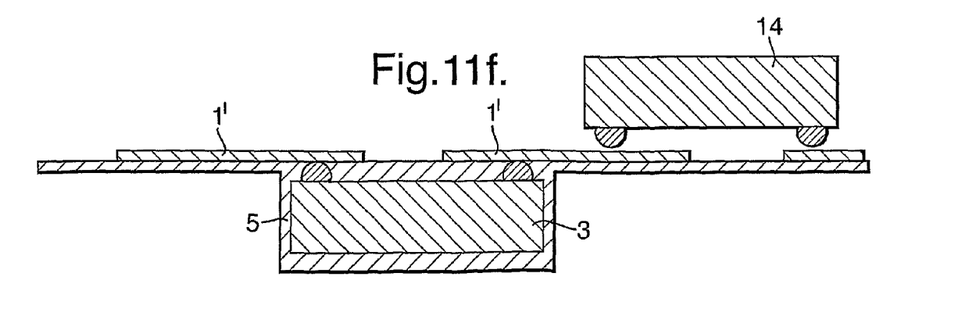

FIGS. 11a to 11c correspond to FIGS. 4a to 4c respectively, but it will be noted in FIG. 11c that the etch resist layer 2 has further pathways so that after etching and stripping of the layer 2 one or more additional components 14 may be applied to the metal foil, thus providing a method of populating both sides of the metal foil with components, i.e. producing a buried component board.

It will be appreciated that in addition to placing semiconductor devices and other components, components such as resistors, inductors or capacitors can be printed directly onto the foil. This applies to each of the foregoing examples. By the use of printable semiconductors (such as conjugated polymers), active components such as thin film transistors, LEDs or memory elements can also be printed.

Figure 12:
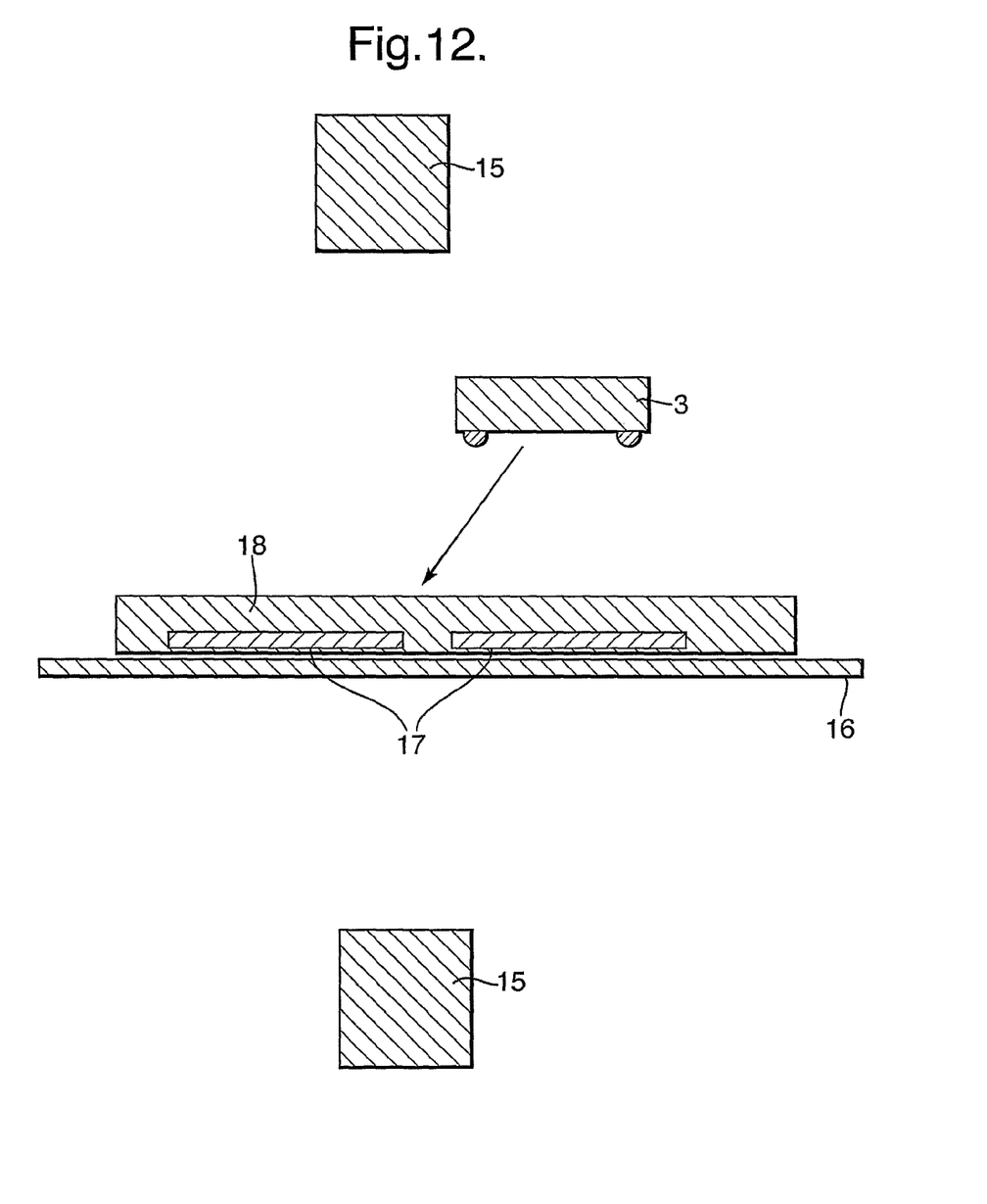
FIGS. 12 and 13 illustrate how camera systems can be used for alignment purposes in the described methods.
Figure 13:
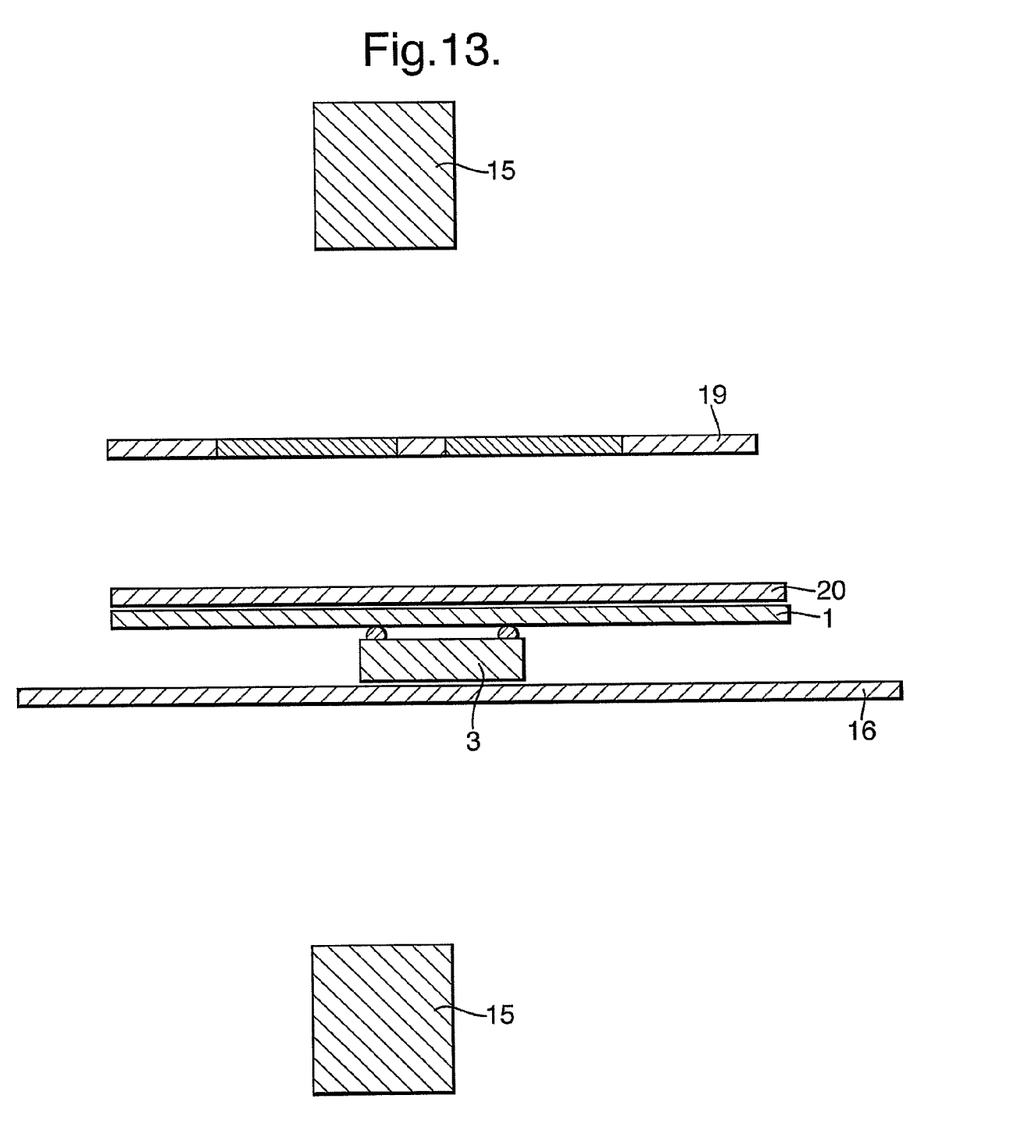

In the production of the intermediate product in the foregoing examples, the chip 3 and layer 2 are disposed on the foil 1 in accurate registration by an optical system, for example as shown in FIG. 12 or 13.

Referring to FIG. 12, two cameras 15 may be disposed on respective sides of a transparent platform 16. A calibration pattern 17 on a transparent substrate 18 is used to ensure that both cameras 15 see an identical view (in terms of magnification and field of view) of the resist pattern. Computer software may then be used to superimpose the images from the two cameras 15 such that the detail of both sides of the calibration pattern are visible on the same image at the same time. The image from one of the cameras must be mirrored about one axis in order to achieve this and this is an option with the available software. When a patterned opaque substrate is then placed on the transparent platform with the pattern facing the lower camera, this vision system may then be used to place a component on the upper side of the substrate in register with the pattern on the underside.

Referring to FIG. 13, the same camera system may be used to align a photo mask 19 with a photo resist layer in the situation where the chip 3 has been previously placed on a metal foil 1. Although this system describes the procedure for placing components or aligning patterns by hand, it will be appreciated that machine vision technology could readily be used to automate such a system, i.e. such that components could be automatically placed relative to a pattern or such that a pattern could be formed (either by printing or lithographic means) in register with a pre-placed device. In particular, the process of digital printing (e.g. inkjet printing, laser printing or laser direct imaging) could be used to print features or connections between components such that the positions of the components are used as the input to a computer programme which then generates the correct image to be printed in order to connect the components.

The three following formulations have been found to be suitable for the ink used for the etch resistant material, where the foil is aluminium foil.

Formulation 1

This is a modification of the applicants' base ink in order to improve metal adhesion as well as resistance to acids.

| Materials | % |
| --- | --- |
| DPGDA[i] | 43.7 |
| CN 2505[ii] | 5.5 |
| DPHA[iii] | 3.3 |
| SR 9003[iv] | 26.2 |
| SR 9050[v] | 15.0 |
| Irgacure 819[vi] | 2 |
| Irgacure 127[vi] | 4.3 |
| Viscosity@25° C. | 23.3 cps |

Formulation 2

A modification of Formulation 1 with an aim to increase hydophobicity by incorporating more non-polar acrylates (HDDA and IBOA) in place of DPGDA and SR9003. Also reduces viscosity.

| Materials | % |
| --- | --- |
| HDDA[vii] | 42.5 |
| CN 2505 | 6.6 |

-continued

| Materials | % |
|---|---|
| DPHA | 4.1 |
| IBOA[viii] | 25.5 |
| SR 9050 | 15.0 |
| Irgacure 819 | 2.0 |
| Irgacure 127 | 4.3 |
| Viscosity@25° C. | 15.1 cps |

Formulation 3

Formulation 2 gave a slightly brittle film and a low viscosity fluid and so was modified with more oligomer (at the expense of the brittle IBOA)

| Materials | % |
|---|---|
| HDDA | 42.5 |
| CN 2505 | 12.6 |
| DPHA | 8 |
| IBOA | 15.6 |
| SR 9050 | 15.0 |
| Irgacure 819 | 2.0 |
| Irgacure 127 | 4.3 |
| Viscosity @ 25° C. | 15.1cps |

[i]Dipropyleneglycol diacrylate - supplied by Cytec Surface Specialities
[ii]Tetrafunctional polyester acrylate oligomer - supplied by Sartomer
[iii]Dipentaerythritol hexaacrylate - supplied by Cytec Surface Specialities
[iv]Neopentylglycol diacrylate - supplied by Sartomer
[v]Acid functional oligomer - supplied by Sartomer
[vi]Photoinitiator - supplied by Ciba Speciality Chemicals
[vii]Hexanediol diacrylate - supplied by Cytec Surface Specialities
[viii]Isobornyl acrylate - supplied by Cytec Surface Specialities Two examples of detailed methods follow:

Example 1

Inkjet printing is used (using two XaarJet 500/40 industrial inkjet printheads and associated drive electronics) to deposit the resist described in Formulation 3 onto a 10 micron thick copper foil. The image is then cured by passing it under a Light Hammer 6 UV lamp from Fusion Systems.

The image is deposited in the form of an antenna for Wireless Local Area Network communication at 2.45 GHz. The antenna is formed of multiple isolated areas, so arranged such that surface mount capacitors and inductors may be placed on the pattern, bridging the gaps between the isolated areas.

Two capacitors and an inductor are prepared for mounting by applying a small amount of a conductive epoxy resin (from ITW Chemtronics) on the contact pads at each end of each device. An insulating epoxy resin (Araldite Rapide—from Huntsman) is applied to each component, between the contact pads—this serves to further secure the device to the substrate but also to provide an insulating sealed region between the contact pads.

The imaging system described in FIG. 12 is used to place the capacitors and inductor onto the reverse side of the metal foil such that they bridge the gaps in the printed resist pattern. The adhesives are then cured in an oven at 60° C. for 2 hours.

A further layer of epoxy resin is then applied across the whole of the component side of the foil. A layer of Melinex 339 PET film (from DuPont Teijin Films) is then laminated onto the epoxy. The whole device is then allowed to cure in the oven at 60° C. for a further 4 hours.

The cured structure is then immersed in a solution of 10% sulphuric acid and 5% potassium persulfate at 50° C. until all the copper foil between the areas of resist has been etched away. A Clincher connector (From FCI) is then used to pierce the whole device structure and make external contact to the antenna for connection to the rest of the circuit.

Example 2

A UHF RFID chip from Texas Instruments was bonded to a 12 μm thick aluminium foil using and anisotropic conductive film IOB-3 from Betchcorp, Colo. The chip was pressed into the film using a pressure of 25 psi, on a hotplate at 50° C. and held in place for 5 seconds. The assembled device was then cured in an oven at 130° C. for 1 hour.

The device was then placed chip-side-down on the sample stage of a DMP-2831 inkjet print system from Dimatix. The DMP-2831 system includes an integrated fiducial recognition camera which was then used to find the indentations produced in the aluminium foil by the contact bumps on the chip. The alignment software included with the DMP-2831 was then used to print the image of a UHF RFID antenna such that the contact point of the antenna lined up with the indentations of the contact bumps. The image was printed using the resist formulation described above as Formulation 3. The resist was cured during the print process using the output fibre of a fibre coupled UV lamp (Exfo) which was retrofitted to the cartridge mount of the DMP-2831.

A Xaar Jet 500/80 print head was then used to print a complete covering of the same resist ink on the reverse (chip) side of the aluminium foil. This was cured using a Light hammer 6 UV lamp from Fusion Systems.

The excess metal was then etched away using a 10% solution of hydrochloric acid.

The result was a self supporting working RFID tag.

The invention claimed is:

1. A method of electrically connecting a component to an electrical circuit, the method comprising forming an intermediate product in which the component is disposed on one side of an electrically conducting sheet so that at least one pair of contacts of the component are electrically connected by the sheet and in which a patterned etch resist layer is disposed on the other side of the sheet in registration with the component on said one side of the sheet, applying a further etch resist layer to said one side of the sheet and to the exposed surface of the component, and then exposing the other side of the sheet to an etching agent and thereby removing areas of the sheet to leave the electrical circuit and also to remove the electrical interconnection between the contacts.

2. A method according to claim 1, wherein the patterned etch resist layer is applied to the other side of the sheet in the required registration by an optical system which locates the position at which the component is disposed on the sheet.

3. A method according to claim 2, wherein the optical system locates indentations in the sheet produced by contact bumps on the component.

4. A method according to claim 3, wherein the etch resist layer is disposed on the other side of the sheet by a digital printing process.

5. A method according to claim 4, wherein the optical system employs two cameras on respective sides of the sheet to achieve said required registration.

6. A method according to claim 5, wherein the intermediate product is formed by applying the patterned etch resist layer to the other side of the sheet and then disposing the component on the one side of the sheet.

7. A method according to claim 5, wherein the intermediate product is formed by disposing the component on said one side of the sheet and then applying the patterned etch resist layer to the other side of the sheet.

8. A method according to claim 1, wherein the further etch resist layer applied to the one side of the sheet wholly or substantially wholly covers the one side of the sheet and thereby forms a substrate.

9. A method according to claim 1, wherein the further etch resist layer applied to the one side of the sheet has a pattern and is exposed to a corresponding etching agent which removes areas of the sheet not covered by the etch resist layer on the one side of the sheet, whereby the electrical circuit is defined by pathways formed by etching from both sides of the sheet.

10. A method according to any claim 9, wherein the etch resist layers are made of the same etch resistant material and are subjected simultaneously to the same etching agent.

11. A method according to claim 1, wherein the further etch resistant layer flows between the chip and the sheet to act as an underfill material.

12. A method according to claim 1, wherein the patterned etch resist layer is removed after etching by the etching agent.

13. A method according to claim 1, wherein the patterned etch resist layer remains in place to form a protective layer for the electrical circuit.

14. A method according to claim 1, wherein the component is adhered to the one side of the sheet by means of an adhesive material.

15. A method according to claim 14, wherein the adhesive material acts as an etch resist material that ensures that the region between the pair of contacts is filled.

16. A method according to claim 1, wherein the intermediate product is formed by adhering the component to said one side of the sheet by an anisotropic conductive material which provides electrical connection between each contact and the sheet without causing an electrical short circuit between the pair of contacts through the anisotropic material.

17. A method according to claim 1, wherein the intermediate product has a plurality of components disposed on said one side of the sheet and the etch resist layer disposed on the other side of the sheet defines electrical pathways forming the electrical circuit in register with the components.

18. A method according to claim 1, wherein the component is an integrated circuit chip.

19. A method according to claim 1, wherein the foil is aluminum foil.

20. A method according to claim 1, wherein at least one additional component is disposed on the other surface of the sheet.

21. A component connected to an electrical circuit by a method according to claim 1.

* * * * *